(12) United States Patent
Sullivan et al.

(10) Patent No.: US 8,563,199 B2
(45) Date of Patent: Oct. 22, 2013

(54) FORMING A BRIDGING FEATURE USING CHROMELESS PHASE-SHIFT LITHOGRAPHY

(75) Inventors: Daniel B. Sullivan, Carver, MN (US); Sangho Kim, St. Paul, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/268,296

(22) Filed: Oct. 7, 2011

(65) Prior Publication Data

US 2013/0089752 A1  Apr. 11, 2013

(51) Int. Cl.
G03F 1/34  (2012.01)

(52) U.S. Cl.
USPC .......................................................... 430/5

(58) Field of Classification Search
USPC .................. 430/5, 311, 312, 313, 394; 355/53
See application file for complete search history.

(56) References Cited

U.S. PATENT DOCUMENTS

| | | | |
|---|---|---|---|
| 5,273,850 A | 12/1993 | Lee et al. | |
| 5,362,584 A | 11/1994 | Brock et al. | |
| 5,487,962 A | 1/1996 | Rolfson | |
| 5,675,164 A | 10/1997 | Brunner et al. | |
| 6,541,167 B2 | 4/2003 | Petersen et al. | |
| 7,354,682 B1 | 4/2008 | Capodieci | |
| 7,618,751 B2 | 11/2009 | Sandstrom et al. | |
| 2006/0147813 A1 | 7/2006 | Tan et al. | |
| 2006/0292455 A1 | 12/2006 | Cheng et al. | |
| 2008/0160428 A1* | 7/2008 | Ha | 430/5 |
| 2008/0284996 A1* | 11/2008 | Lei et al. | 355/53 |

OTHER PUBLICATIONS

Ferguson et al., "Pattern-Dependent Correction of Mask Topography Effects for Alternating Phase-Shifting Masks", SPIE, vol. 2440, Feb. 1995, pp. 349-360.
Gordon et al.. "Design and Analysis of Manufacturable Alternating Phase-Shifting Masks", 18$^{th}$ Annual BACUS Symposium on Photomask Technology, 1998, 12 pages.
Liu et al., "The Application of Alternating Phase-Shifting Masks to 140 nm Gate Patterning (II): Mask Design and Manufacturing Tolerances", SPIE vol. 3334, 1998, pp. 2-14.
Ryhins et al., "Characterization of Quartz Etched PSM Masks for KrF Lithography at the 100 nm Node", 21$^{st}$ Annual BACUS Symposium on Photomask Technology, 2002, pp. 486-495.
May 15, 2013, File history for U.S. Appl. No. 13/269,086.

* cited by examiner

Primary Examiner — Stephen Rosasco
(74) Attorney, Agent, or Firm — Hollingsworth Davis, LLC

(57) ABSTRACT

An elongated, chromeless, bridging feature is formed on a photolithography mask with an etching depth that causes a nominal phase difference of more than 180 degrees to energy passing through the photolithography mask. A corresponding photoresist feature is formed using the bridging feature. The phase difference may be chosen to minimize dimensional variation of the corresponding photoresist feature.

18 Claims, 6 Drawing Sheets

FORMING A BRIDGING FEATURE USING CHROMELESS PHASE-SHIFT LITHOGRAPHY

SUMMARY

Various embodiments described herein are generally directed to methods, systems, and apparatuses that facilitate forming features using chromeless, phase-shift lithography. In one embodiment, a method involves forming an elongated, chromeless, bridging feature on a photolithography mask with an etching depth that causes a nominal phase difference of more than 180 degrees to energy passing through the photolithography mask. A corresponding photoresist feature is formed using the bridging feature.

In another embodiment, a photolithography mask includes an elongated, chromeless, bridging feature with an etching depth that causes a nominal phase difference of more than 180 degrees to energy passing through the photolithography mask. The energy is used to form a corresponding photoresist feature based on the bridging feature.

In another embodiment, an article of manufacture is prepared by a process that includes forming a corresponding photoresist feature on the article of manufacture via on an elongated, chromeless, bridging feature of a photolithography mask. The bridging feature is formed with an etching depth that causes a nominal phase difference of more than 180 degrees to energy passing through the photolithography mask. A width of the bridging photoresist feature is between 30 nm and 50 nm, and a span of the bridging photoresist feature is at least ten times greater than a width of the bridging photoresist feature.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures.

DETAILED DESCRIPTION

Figure 1A:
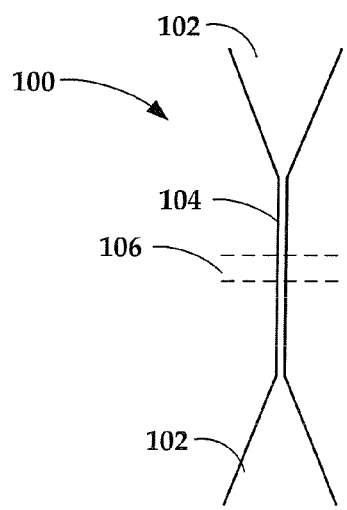
FIG. 1A is an aerial/plan view of a photoresist feature according to an example embodiment.

The present disclosure relates generally to manufacturing techniques and processes that utilize photolithography. For example, various embodiments described below pertain to forming small scale photoresist features using chromeless photolithography masks. Photolithography is part of a process used for fabricating microscopic components (e.g., electrical circuits, optical components) that are generally made of thin films layered on a substrate. These processes may involve depositing, then selectively removing, parts of a thin film (or the substrate itself) based on a geometric pattern formed with layer of photoresist material.

In the photolithography process, electromagnetic energy (e.g., light) is transmitted through a mask/reticle to expose parts of the photoresist layer in the desired pattern. The exposed photoresist is subjected to a chemical treatment (e.g., "developing") that removes areas of photoresist that were exposed to the light. In other cases, the areas not exposed to light may instead be removed by the developer. In either case, the resulting surface has a patterned formed by the developed photoresist, and the surface can then be further treated. For example, etching may be performed so that exposed areas of the surface are etched away, while those areas covered by the photoresist are unaffected.

Photolithography is commonly associated with the manufacture of integrated electronic circuits. Photolithography can also used in making integrated optics, which includes optical components (e.g., lasers, waveguides, lenses, mirrors, collimators, etc.) that are formed on a substrate in a manner analogous to integrated electrical circuits, except that materials and shapes are chosen to have the desired optical characteristics instead of or in addition to desired electrical characteristics.

In the past few decades, the desire to make ever more densely packed integrated devices has necessitated changes to the photolithography process to form smaller individual feature sizes, often referred to by the term "minimum feature size" or "critical dimension" (CD). The CD is approximated by the formula $CD = k_1 * \lambda / NA$ where $k_1$ a process-specific coefficient, $\lambda$ is the wavelength of applied light/energy, and NA is the numerical aperture of the optical lens as seen from the wafer.

The ability to project a usable image of a small feature onto a wafer is limited by the wavelength $\lambda$, the ability of the projection optics to capture enough diffraction orders from the illuminated mask, and the manufacturing specific variables represented by $k_1$. When features made from a binary photomask (a pattern of opaque material such as chrome overlaid on a clear substrate such as quartz) are of a certain size and/or shape, the transitions between light and dark at the edges of the projected image may not be sharply defined enough to correctly form the target photoresist features. This may result, among other things, in reducing quality of resist profiles. As a result, features 150 nm or below in size may need to utilize phase shifting to enhance the image quality at the wafer, e.g., sharpening edges of features to improve resist profiles.

Phase-shifting generally involves selectively changing phase of part of the energy passing through a mask/reticle so that the phase-shifted energy is additive or subtractive with unshifted energy at the surface of the wafer. By carefully controlling the shape, location, and phase shift angle of mask features, the resulting photoresist patterns can have more precisely defined edges. These phase shifts may be obtained in a number of ways. For example, one process known as attenuated phase shifting utilizes a layer of non-opaque material that causes light passing through the material to change in phase compared light passing through transparent parts of the mask. Another technique is known as alternating phase shift, where the transparent mask material (e.g., quartz) is etched to different depths. The depths can be chosen to cause a desired relative phase shift in light passing through the different depths.

An alternating phase shift mask can be formed using opaque patterns in combination with phase shifting features. In other cases, what is known as a "chromeless" phase shift mask uses phase shift features alone to define the features. While a chromeless mask may forgo the use of chrome or other opaque features over the entire mask, in the present disclosure the term "chromeless mask" is intended to at least define a particular feature or set of features within the mask that relies on phase shift alone to define a photoresist feature. In such a case, the chromeless mask may use opaque/binary features elsewhere, either with or without phase shifting features.

In reference now to FIG. 1A, a diagram illustrates an example photoresist feature 100, which is a desired shape resulting from light being projected on a wafer through a mask as discussed in detail hereinbelow. The photoresist feature 100 generally includes first and second anchors 102, which in this example are triangular shapes. A bridge 104 is generally an elongated, straight line running from center points of the anchors 102. These features 102, 104 may be used to ensure that material is deposited in a region of interest 106 having a specified dimension and location. After creation and treatment of the photoresist feature 100 (e.g., exposure, development, etching), parts of the feature 100 outside the region of interest 106 may be later removed, e.g., through processes such as chemical mechanical polishing/planarization (CMP).

In one example, this region of interest 106 may define a generally rectangular magnetoresistive stack of a hard drive reader. However, it will be appreciated that a photoresist feature such as feature 100 may be used in forming any related electrical or optical component. For example, any optical or electrical component of conventional and heat assisted recording read/write heads may be formed using a feature similar to feature 100 and parts thereof, including write poles, shields, waveguides, near-field transducers, mirrors, collimators, heaters, etc.

In embodiments described below, the target span length of bridge 104 is 0.50 μm, and the CD of the region of interest is on the order of 50 nm (e.g., between 30 nm to 60 nm). Accordingly, the span of the bridge is an order of magnitude greater than (e.g., ten times or more than) the width of the span. Although the order of magnitude of these dimensions may have some relevancy to the concepts described herein, it will be appreciated that the embodiments described herein are not intended to only be limited to these values/ranges unless otherwise stated.

Figure 1B:
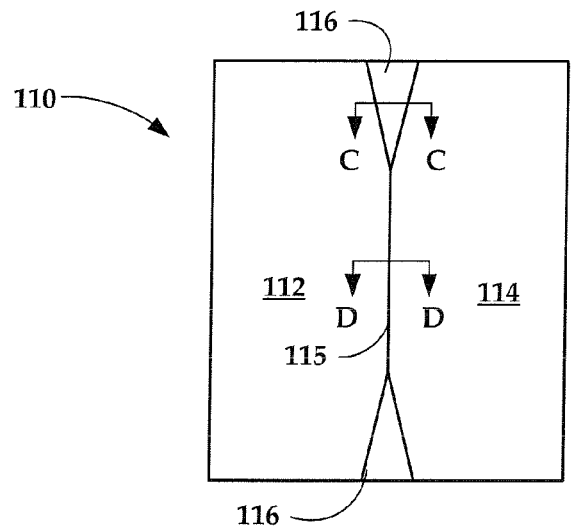
FIG. 1B is an aerial/plan view of a mask according to an example embodiment.

In FIG. 1B, an aerial/plan view shows a mask 110 usable to make the feature 100 shown in FIG. 1A. The anchors 102 are formed by anchor features 116 on the mask 110. The bridging feature 104 is formed by transition 115 between regions 112, 114. The anchor features 116 may use an opaque overlay (e.g., chrome) along with a phase shift transition between regions 112, 114, but the bridging transition 115 is at least chromeless. Cross sections C-C and D-D of the mask 110 according to an example embodiment are shown in FIGS. 1C and 1D, respectively.

Figure 1C:
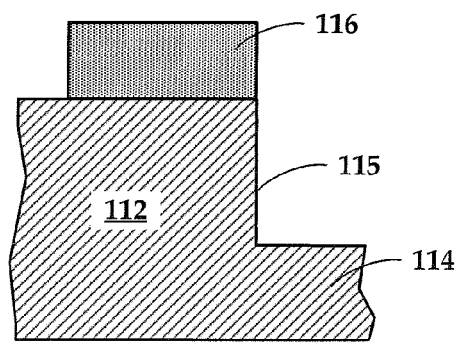
FIGS. 1C and 1D are cross section views corresponding to section lines C-C and D-D, respectively, of the mask shown in FIG. 1B.
Figure 1D:
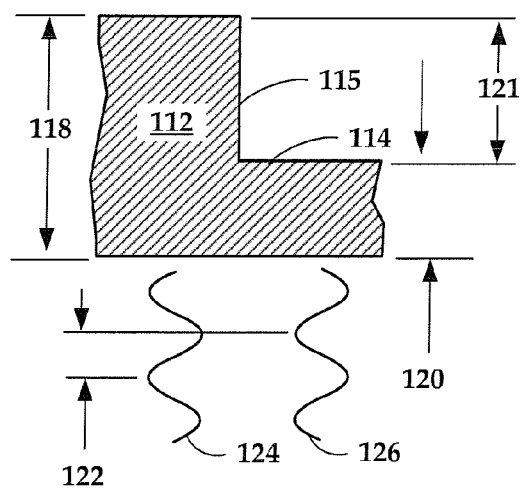

As seen in FIG. 1C, feature 116 is defined by a chrome layer, and one edge of transition 115 may also form part of feature 116 at this location. It can be seen in FIG. 1D seen that there is no chrome overlay along the middle of transition 115 (e.g., at or near area of interest 106), and the transition 115 alone forms the bridge 104 of the photoresist feature 100. Also seen in FIG. 1D, thicknesses 118, 120 of respective portions 112, 114 are different, due to etching by depth 121. This depth difference 121 causes light 124 passing through portion 112 to be phase shifted 122 relative to light 126 passing through portion 114. The amount of phase shift 122 can be adjusted by changing the relative size of these dimensions 118, 120.

It is generally thought that creating a nominal chromeless phase shift 122 of 180 degrees is optimal, e.g., providing the highest resolution enhancement for features formed on a photoresist. However, this assumption may not take into account other factors that may factor in when attempting to create photoresist features in a large-scale, manufacturing environment. For example, all components used in the photolithography process will have some tolerance associated with it. So, while, e.g., the mask 110 may be formed with nominal dimensions 118, 120 as described above, this nominal dimension may be expected to exhibit some variation, both within parts of the feature 100, and among similar features elsewhere on the mask 110.

In the present disclosure, configurations of the mask 110 are described that may reduce CD variations resulting from the photoresist process. These variations may be expressed herein as three-sigma (3σ) deviation of CD. Generally, a 3σ variation assumes that the resulting CD variation is normally distributed, and that about 99.73% of features formed will not deviate by the CD variation value. The target variation value may differ (e.g., 6σ) depending on the particular process or product to which the measure of variation pertains. The particular 3σ variations described herein are provided for purposes of example as being applicable to fabrication of hard drive read/write head components, but may be equally applicable to any other manufactured product that uses phase shift photolithography.

As previously mentioned, the critical dimension in optical lithography can be expressed a function of three parameters, CD=$k_1$*λ/NA. It is also desirable to reduce the variations of the CD, e.g., the difference between equivalent features formed using the same pattern on the same and/or different wafers. One way to reduce the variation of the CD is to reduce the CD itself. For a particular manufacturing process, the λ/NA factors may be relatively fixed. In such a case, reducing CD error may involve reducing the $k_1$ value, e.g., by investing in next-generation lithography tools. However, these tools can cost tens of millions of dollars to buy, and incur further expenses in fixtures, training, etc. As a result, there is an incentive to minimize manufacturing tolerances using existing lithography tools. For example, in forming a feature 100 as shown in FIG. 1A, a 3σ variation of the CD was estimated as being 3.5 nm using a nominal phase shift 122 of 180 degrees. However, it was found that by changing the amount of this nominal phase shift, the 3σ variation can be reduced considerably, e.g., to around 0.5 nm using a nominal phase shift of 186.4 degrees.

In order to calculate the etching depth, one can use the optical path Equation [1] below. Based on a 180 degree phase shift with tolerance of ±4 degrees, the final etching depth with depth tolerance can be calculated as shown in Equation [2] below. In this equation, the mask is assumed to be quartz (SiO$_2$) and the wavelength λ is 193 nm.

$$d(\text{nm}) = \frac{\Delta\varphi(\text{rad}) \cdot \lambda}{2\pi(n_{SiO2} - 1)} \qquad [1]$$

$$d(\text{nm}) = \frac{\Delta\varphi(deg) \cdot \lambda}{360(n_{SiO2} - 1)} = \frac{(180 \pm 4) \cdot 193}{360(1.563 - 1)} \quad [2]$$

$$d = 171.4 \pm 3.8 \text{ nm}$$

Figure 2:
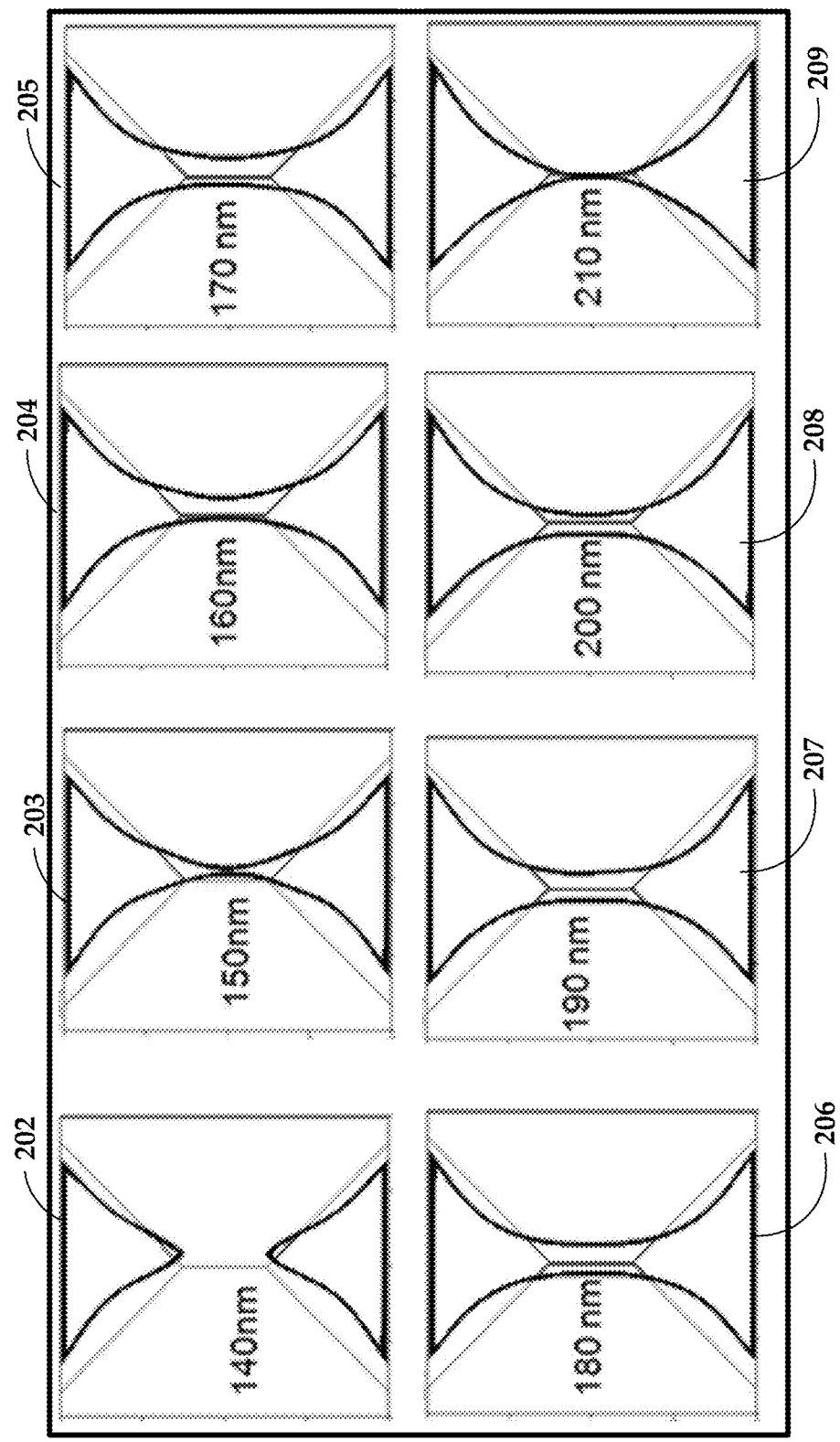
FIG. 2 is a series of simulation results of photoresist features formed using different etch depths according to an example embodiment.

It can also be seen that, based on equation [2], the phase difference in this example can be expressed as $\Delta\phi$ (deg)=1.05*d(nm). With the help of lithographic simulation software, various etching depths can be simulated and compared. Examples of these simulation results are shown in FIG. 2, which includes a number of simulated resulting photoresist patterns 202-209 which are overlaid on a representation of the mask used to create the patterns 202-209. As seen here, the minimal change in the size of the bridging portion of the patterns 202-209 relative to changing etching depth occurs around 180-190 nm, which corresponds to a phase shift of approximately 189-199 degrees. It can be seen that at some etching depths (e.g., depths 140 nm, 150 nm, and 210 nm in respective examples 202, 203, and 209) the bridging feature is either not resolved at all, or only nearly so. It is also noted that the simulated photolithography features exhibit an offset compared to the mask features. In the representative example of FIG. 2, as the etching depth increases, the center offset moves from right to left.

Figure 3:
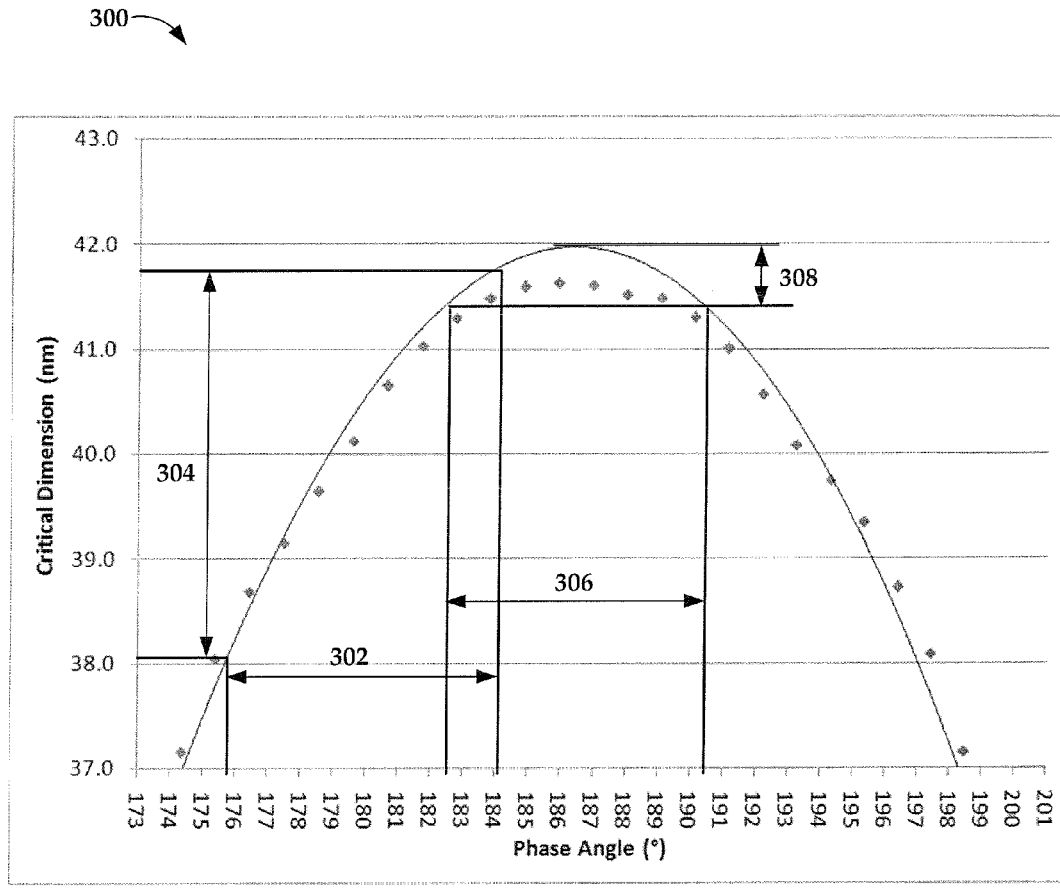
FIG. 3 is a graph of the results of the simulations such as shown in FIG. 2.

In FIG. 3, a graph 300 summarizes results of a large number of simulations such as are shown in FIG. 2. Range 302 represents a current estimated etching depth tolerance (±4°), which results in variation 304 in the CD (3.5 nm) for the aforementioned bridging feature 104 when the nominal etching depth is about 171 nm (about 180 degrees). Range 306 is similar in size to 302 (depth tolerance of ±4°), but now centered on nominal phase shift of 186.4 degrees, which results in a noticeably smaller CD variance 308 of about 0.54 nm.

Figure 4:
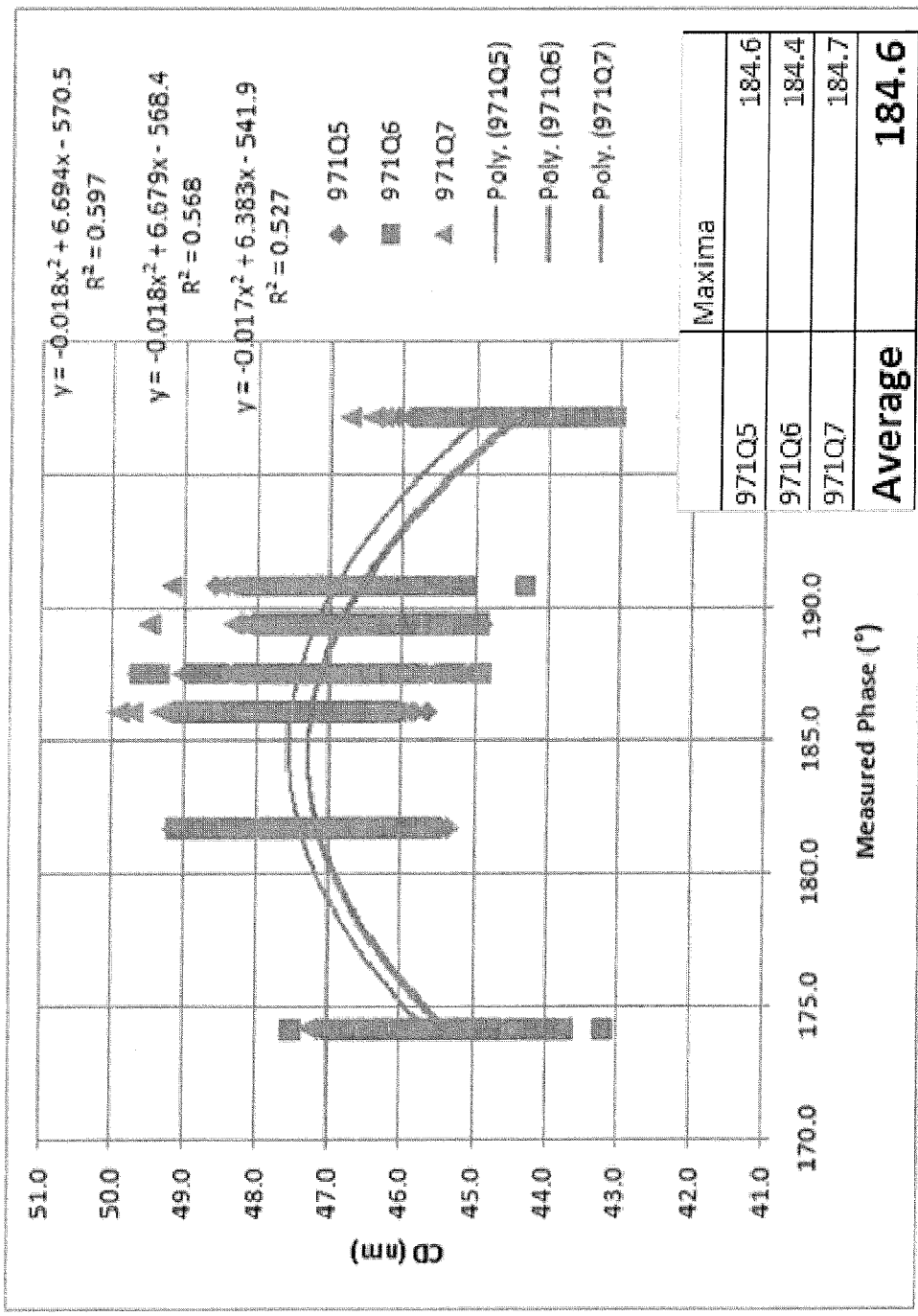
FIG. 4 is a graph of empirical results similar to the simulations shown in FIGS. 2 and 3.

In FIG. 4, a graph illustrates experimental results of photolithography features formed according to example embodiments described herein. This graph reflects empirical data collected based on features implemented using the parameters of the simulated results seen in FIGS. 2 and 3. The simulation in FIGS. 2 and 3 suggests using a nominal phase shift of 186.4 degrees. The empirical results are shifted slightly, and suggest using a nominal phase shift of 184.6 degrees. This correlates well with the simulated results, and between the simulated and empirical results, a nominal phase shift between 183 and 187 degrees will produce the desired effect. Depending on other parameters, e.g., span length, span width, mask and photoresist materials, exposure wavelength, etc., a wider phase shift range of between 180 and 190 degrees may be applicable.

One artifact seen in creating the above-described photoresist features using chromeless phase-shift lithography is bending of the bridging feature. In reference again to FIG. 1A, the bridging feature 104 is sometimes subject to transverse bending (or "span bending") in the middle near region of interest 106. This may be due at least in part to optical interference caused by the anchor features 102. This can negatively affect proper location of the feature 104 within this region 106, and may also negatively affect shape and/or dimension of the feature 104. An analysis of how mask etching depth 121 may also affect span bending was performed, and the results of this analysis is shown in the graph of FIG. 6.

Figure 6:
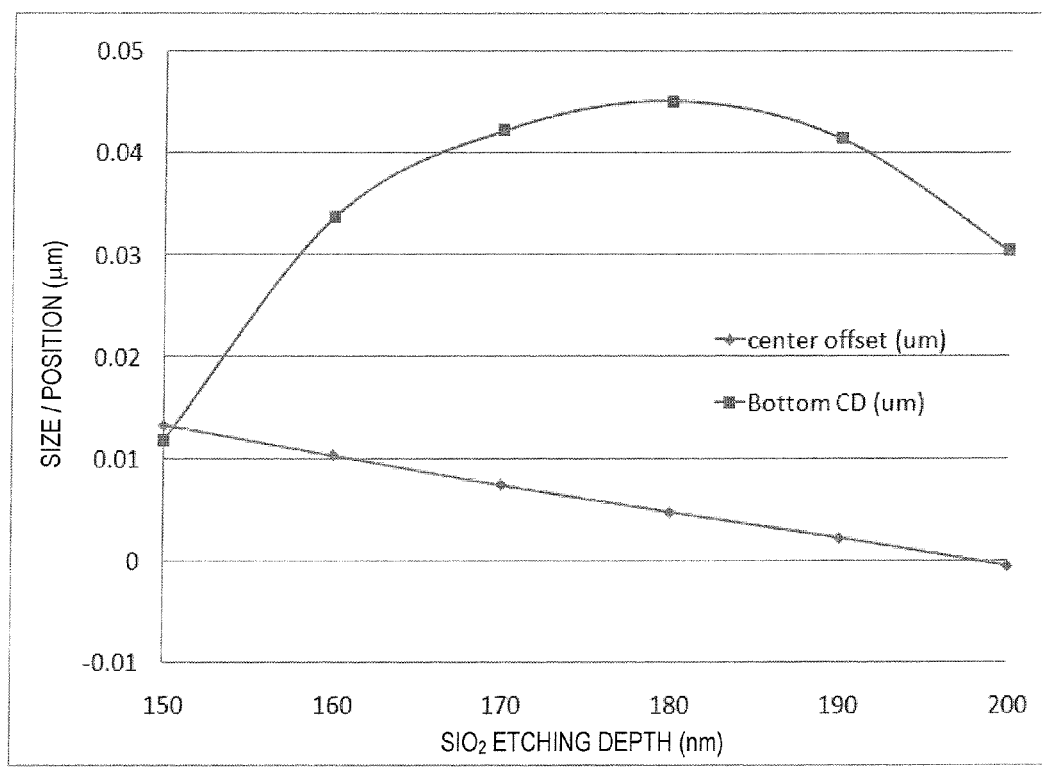
FIG. 6 is a graph illustrating analysis of the affect of etching depth on span bending of a photoresist feature according to example embodiments.

As seen in the graph of FIG. 6, the span bending of the bridging feature (as measured by distance offset from centerline between anchor features) decreases linearly with increasing etching depth. The CD of the feature, also plotted in this graph, exhibits minimal change versus etching depth at around 180 nm which corresponds to around 189 degrees for this type of quartz mask and etching process, which corresponds to the findings described above. As a result, an increase in mask phase reduces span bending in the bridging feature.

Figure 5:
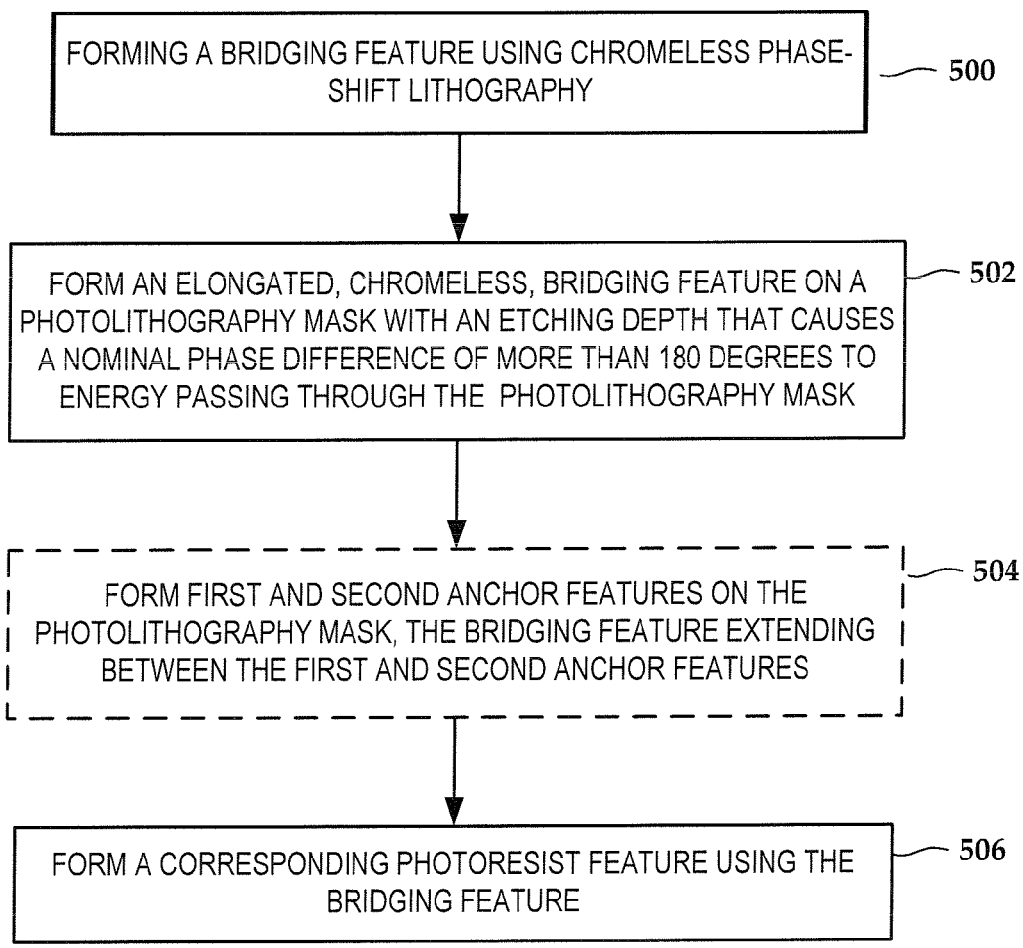
FIG. 5 is a flowchart illustrating a procedure according to an example embodiment.

In reference now to FIG. 5, a flowchart illustrates a procedure 500 for forming a bridging feature using chromeless phase-shift lithography according to an example embodiment. The procedure involves 502 forming an elongated, chromeless, bridging feature on a photolithography mask with an etching depth that causes a nominal phase difference of more than 180 degrees to energy passing through the photolithography mask. The procedure optionally involves forming 504 first and second anchor features on the photolithography mask, wherein the bridging feature extends between the first and second anchor features. A corresponding photoresist feature is formed 506 using the bridging feature.

The foregoing description of the example embodiments has been presented for the purposes of illustration and description. It is not intended to be exhaustive or to limit the invention to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A method comprising:
    forming an elongated, chromeless, bridging feature on a photolithography mask with an etching depth that causes a nominal phase difference of more than 180 degrees to energy passing through the photolithography mask; and
    forming a corresponding photoresist feature using the bridging feature.

2. The method of claim 1, wherein the phase difference is chosen to minimize dimensional variation of the corresponding photoresist feature.

3. The method of claim 1, wherein the phase difference is chosen to minimize span bending of the corresponding photoresist feature.

4. The method of claim 1, wherein the nominal phase difference is between 180 and 190 degrees.

5. The method of claim 1, further comprising forming first and second anchor features on the photolithography mask, wherein the bridging feature extends between the first and second anchor features.

6. The method of claim 5, wherein the first and second anchor features are formed using a combination of phase shift etch and opaque overlay on the photolithography mask.

7. The method of claim 1, wherein a span of the corresponding photoresist feature is at least ten times greater than a width of the corresponding photoresist feature.

8. The method of claim 7, wherein the width of the corresponding photoresist feature is between 30 nm and 50 nm.

9. The method of claim 1, wherein a region of interest of the corresponding photoresist feature is used to form a feature of a read/write head.

10. A photolithography mask, comprising:
    an elongated, chromeless, bridging feature with an etching depth that causes a nominal phase difference of more than 180 degrees to energy passing through the photolithography mask, the energy forming a corresponding photoresist feature based on the bridging feature.

11. The photolithography mask of claim 10, wherein the phase difference is chosen to minimize dimensional variation of the corresponding photoresist feature.

12. The photolithography mask of claim 10, wherein the phase difference is chosen to minimize span bending of the corresponding photoresist feature.

13. The photolithography mask of claim 10, wherein the nominal phase difference is between 180 and 190 degrees.

14. The photolithography mask of claim 10, further comprising first and second anchor features, wherein the bridging feature extends between the first and second anchor features.

15. The photolithography mask of claim 14, wherein the first and second anchor features are formed using a combination of phase shift etch and opaque overlay on the photolithography mask.

16. The photolithography mask of claim 10, wherein a span of the corresponding photoresist feature is at least ten times greater than a width of the corresponding photoresist feature.

17. The photolithography mask of claim 16, wherein the width of the corresponding photoresist feature is between 30 nm and 50 nm.

18. The photolithography mask of claim 10, wherein a region of interest of the corresponding photoresist feature is used to form a feature of a read/write head.

* * * * *